United States Patent
Li et al.

(10) Patent No.: US 6,872,599 B1
(45) Date of Patent: Mar. 29, 2005

(54) ENHANCED SOLDER JOINT STRENGTH AND EASE OF INSPECTION OF LEADLESS LEADFRAME PACKAGE (LLP)

(75) Inventors: Felix C. Li, San Jose, CA (US); Jaime A. Bayan, Palo Alto, CA (US); Santhiran Nadarajah, Melaka (MY); Ah Lek Hu, Melaka (MY)

(73) Assignee: National Semiconductor Corporation, Santa Clara, CA (US)

( * ) Notice: Subject to any disclaimer, the term of this patent is extended or adjusted under 35 U.S.C. 154(b) by 199 days.

(21) Appl. No.: 10/316,788

(22) Filed: Dec. 10, 2002

(51) Int. Cl.[7] .................. H01L 21/44; H01L 21/48; H01L 21/50
(52) U.S. Cl. .................. 438/123; 438/15; 438/16; 438/17
(58) Field of Search .................. 438/123, 15, 16, 438/17, 106, 107, 112, 114

(56) References Cited

U.S. PATENT DOCUMENTS

| | | | | |
|---|---|---|---|---|
| 5,998,234 A | * | 12/1999 | Murata et al. ............... 438/53 |
| 6,083,776 A | * | 7/2000 | Manteghi ................... 438/123 |
| 6,229,200 B1 | * | 5/2001 | Mclellan et al. ............ 257/666 |
| 6,242,281 B1 | * | 6/2001 | Mclellan et al. ............ 438/106 |
| 6,278,618 B1 | * | 8/2001 | Lee et al. ................... 361/820 |
| 6,372,539 B1 | * | 4/2002 | Bayan et al. ............... 438/106 |
| 6,399,415 B1 | * | 6/2002 | Bayan et al. ............... 438/106 |
| 6,400,004 B1 | * | 6/2002 | Fan et al. .................... 257/666 |
| 6,410,363 B1 | * | 6/2002 | Tani et al. .................. 438/112 |
| 6,448,107 B1 | * | 9/2002 | Hong et al. ................. 438/106 |
| 6,511,863 B2 | * | 1/2003 | Farnworth et al. .......... 438/106 |
| 6,603,194 B2 | * | 8/2003 | Utsumi et al. .............. 257/667 |
| 6,617,197 B1 | * | 9/2003 | Bayan et al. ............... 438/112 |
| 6,723,585 B1 | * | 4/2004 | Tu et al. ..................... 438/123 |
| 6,777,800 B2 | * | 8/2004 | Madrid et al. ............. 257/690 |
| 6,797,540 B1 | * | 9/2004 | Li et al. ..................... 438/111 |
| 2001/0030355 A1 | * | 10/2001 | Mclellan et al. ............ 257/666 |
| 2003/0230792 A1 | * | 12/2003 | Wu et al. .................... 257/666 |
| 2004/0207054 A1 | * | 10/2004 | Brown et al. ............... 257/676 |

* cited by examiner

*Primary Examiner*—Richard Elms
*Assistant Examiner*—Michael K. Luhrs
(74) *Attorney, Agent, or Firm*—Beyer Weaver & Thomas, LLP (57) ABSTRACT

Methods of fabricating leadless packages are described that provide good solder joint reliability. In most respects, the packages are fabricated in a manner similar to current lead frame based leadless packaging techniques. However, at some point in the process, the contacts are provided with undercut regions that are left exposed during solder plating so that the solder plating also covers the exposed side and undercut segments of the contacts. When the resultant devices are soldered to an appropriate substrate (after singulation), each resulting solder joint includes a fillet that adheres very well to the undercut portion of contact. This provides a high quality solder joint that can be visually inspected from the side of the package.

13 Claims, 10 Drawing Sheets

ENHANCED SOLDER JOINT STRENGTH AND EASE OF INSPECTION OF LEADLESS LEADFRAME PACKAGE (LLP)

BACKGROUND OF THE INVENTION

The present invention relates generally to the packaging of integrated circuits. More particularly, the invention relates to leadless packaging designs and processes.

Figure 1A:
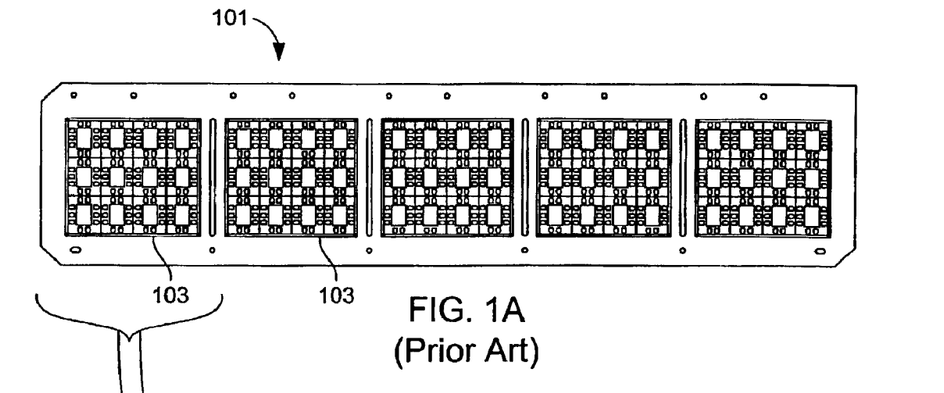
FIGS. 1A–1C diagrammatically illustrate a lead frame strip suitable for use in forming leadless lead frame packages.
Figure 1B:
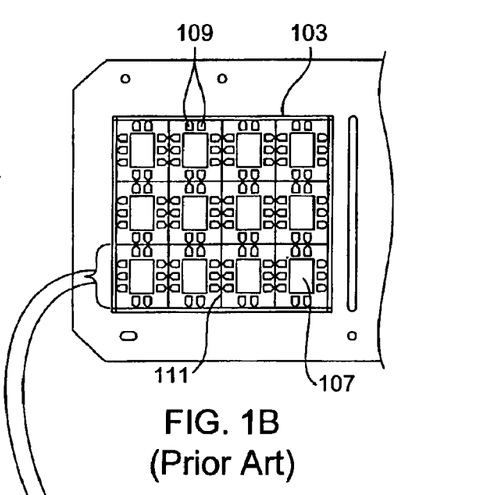
Figure 1C:
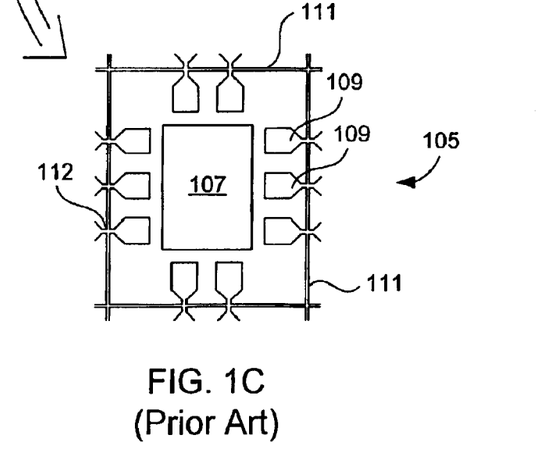

A leadless lead frame package (LLP) is an integrated circuit package design that contemplates the use of a lead frame in the formation of a chip scale package (CSP). The resulting packages are sometimes referred to as quad flat packs—no lead (QFN) packages. As illustrated in FIGS. 1(A)–1(C), in typical leadless lead frame packages, a copper lead frame strip or panel 101 is patterned (typically by stamping or etching) to define a plurality of arrays 103 of device areas 105. Each device area 105 includes a die attach pad 107 and a plurality of contacts 109 disposed about their associated die attach pad 107. Very fine tie bars are often used to support the die attach pads 107 and contacts 109. The contacts 109 are generally attached to the tie bars 111 by tie bar stubs 112.

Figure 6A:
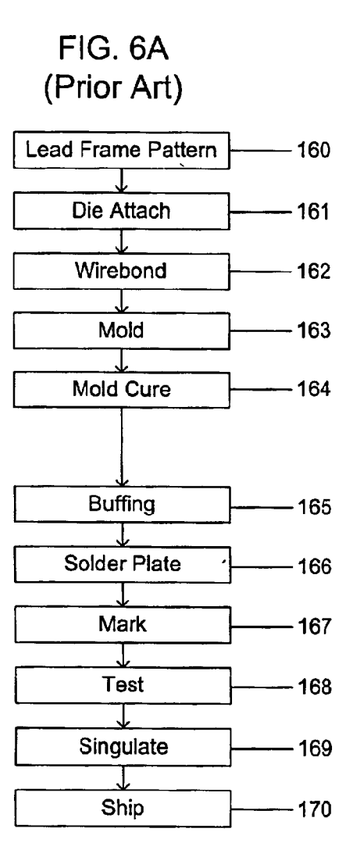
FIG. 6A is a flow chart illustrating a packaging process.

During assembly, dice are attached to the respective die attach pads 107 and conventional wire bonding is used to electrically couple bond pads on each die to their associated contacts 109 on the lead frame strip 101. After the wire bonding, a plastic cap is molded over the top surface of the array 103 of wire-bonded dice. The dice are generally then singulated and tested using conventional sawing and testing techniques. One assembly process is illustrated graphically in steps 160–170 of FIG. 6(A).

Figure 2A:
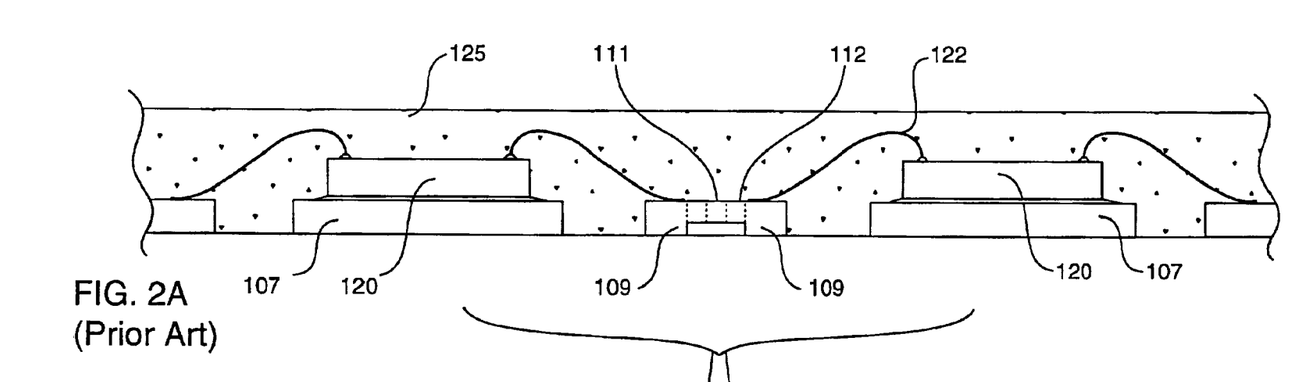
FIG. 2A is a diagrammatic cross sectional side view of a small section of the lead frame panel of FIG. 1C after encapsulation and solder plating.
Figure 2B:
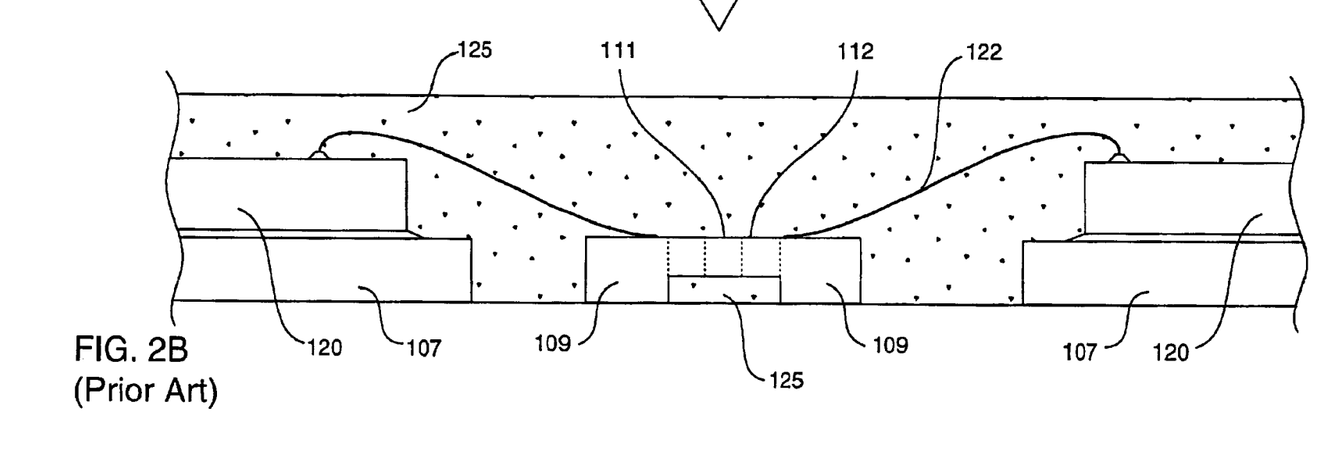
FIG. 2B is an enlarged view of the contact/tie bar region of FIG. 2A.

FIGS. 2A and 2B illustrate a segment of a molded lead frame panel prior to singulation. The die attach pad 107 supports a die 120 which is electrically connected to its associated contacts 109 by bonding wires 122. A plastic casing 125 encapsulates the die 120 and bonding wires 122 and fills the gaps between the die attach pad 107 and the contacts 109, thereby serving to hold the contacts in place. Once the plastic casing 125 has cured, the bottom surfaces of the contacts 109 and the die attach pad 107 are buffed and solder-plated prior to singulation. The solder plating may form a thin solder layer 140 on the bottom surface of the die attach pads and contacts.

Figure 2C:
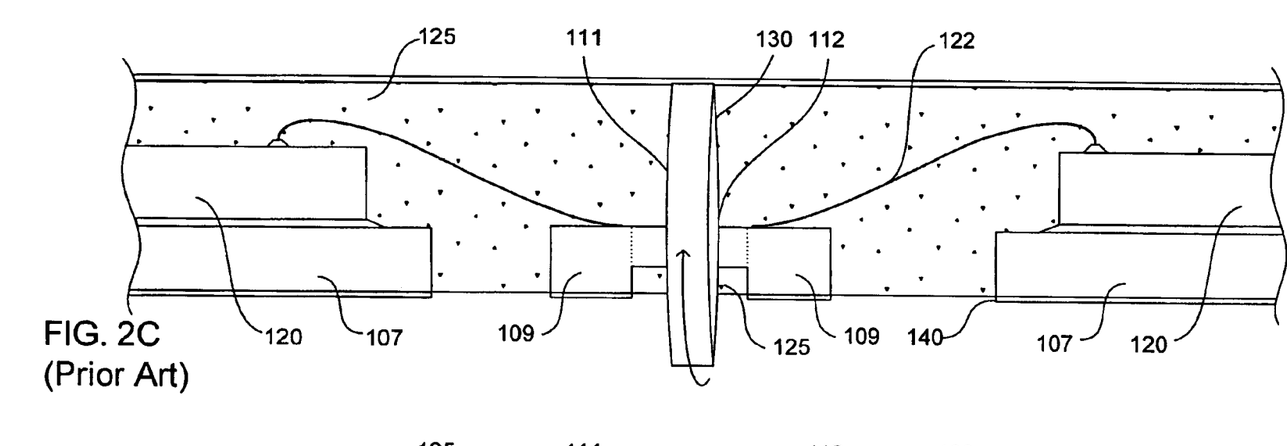
FIG. 2C diagrammatically illustrates a singulation sawing operation on the lead frame panel of FIG. 2B.
Figure 5A:
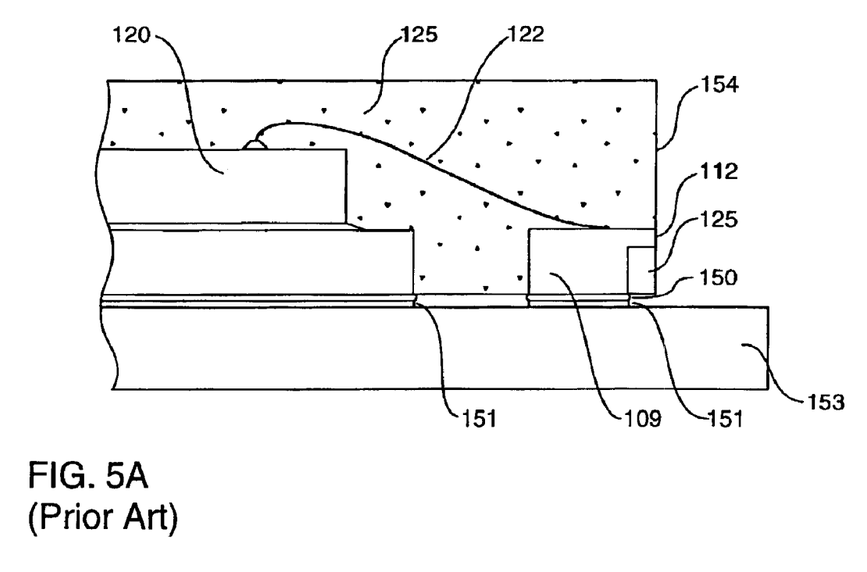
FIG. 5A is a diagrammatic cross sectional side view of an existing leadless lead frame package mounted on a printed circuit board.

FIG. 2C illustrates a sawing-based singulation (or dicing) process. As shown therein, a saw blade 130 is directed along the tie bar axis, thereby severing the tie bar 111 (and removing corresponding portions of the molding material 125 and often a small portion of the tie bar stubs 112) as it proceeds. Once the tie bar 111 has been severed, only the molding material 125 holds the contacts 109 in place. The process is repeated along each tie bar in the two-dimensional matrix of tie bars, with a single pass being used to cut along each tie bar. When the dicing is complete, the resulting packaged chip can then be surface-mounted on a printed circuit board or other substrate using conventional techniques, such as soldering, as generally illustrated in FIG. 5A. As seen therein, compact solder joints 150 are typically formed between the package and the corresponding attach pads 151.

Since leadless lead frame packaging have proven to be a cost effective packaging arrangement, there are continuing efforts to provide further improvements to the package structure and/or processing to permit the package style to be used in additional applications and/or to improve specific characteristics of the resultant devices.

SUMMARY OF THE INVENTION

To achieve the foregoing and other objects of the invention, methods of fabricating leadless packages are described that provide improved solder joint reliability and visibility. In most respects, the packages are fabricated in a manner similar to current lead frame based leadless packaging techniques. By way of example, a lead frame panel may be patterned to define a plurality of device areas and a matrix of tie bars. Each device area includes a multiplicity of conductive contacts that are attached to an associated tie bar. At some point in the process, the contacts are provided with undercut regions that are left exposed during solder plating so that the solder plating covers the exposed side and undercut segments of the contacts. After the solder plating, the lead frame panels may be processed in a conventional manner including singulation. When the resultant devices are soldered to an appropriate substrate, each resulting solder joint includes a fillet that adheres very well to the undercut portion of the contact. This provides a high quality solder joint that can be visually inspected and tested from the side of the package.

A variety of processes are described that facilitate the production of leadless packages having solder plated undercut regions that require little modification to existing production processes. For example, during assembly, dice are attached to die attach pads or otherwise positioned within associated device areas. The dice are then electrically connected to the contacts (e.g., by wire bonding). A casing is then molded or otherwise provided that encapsulates the die and connectors while leaving the bottom surfaces of the contacts exposed. In one aspect of the invention, after the encapsulation, portions of the contacts adjacent to the tie bars are undercut without severing the tie bars. By way of example, undercutting can be accomplished by a partial depth sawing operation along the tie bars. This undercutting exposes some side and underside surfaces of the contacts. The lead frame is then solder-plated in a conventional manner. In addition to plating the bottom surfaces of the contacts, the solder plating also covers the exposed side and underside surfaces of the contacts. After the solder plating, the lead frame panels may be processed in a conventional manner including singulation.

In other embodiments, the contacts are patterned to have a stub portion that attaches to the tie bars and a base portion that includes the exposed bottom surface. The stub portions are preferably thinner and narrower than the base portions of their associated contacts. In some embodiments, the lead frame is patterned to define at least one two-dimensional array of immediately adjacent device areas that are separated only by the tie bars. One approach to undercutting the contacts in such an arrangement contemplates first making a shallow cut along the tie bar axes. The first cutting operation is arranged to expose the stubs and a side portion of the base of each contact, but does not sever the tie bars or the stubs. After the solder plating and other desired processing is finished, the individual packages may be singulated by a second cutting operation along the tie bar axes. In some described embodiments, the first cutting operation is preformed using a first saw blade and the second cutting operation is performed using a second saw blade that is narrower than the first blade.

In another aspect of the invention, wells are formed in the contact portions of the lead frame during the initial patterning of the lead frame. The wells are exposed on the bottom surface of the contacts but have side walls that prevent encapsulant from filling the wells during the encapsulation process. Exposing the wells during initial patterning of the lead frame eliminates the need to partially cut the contacts because the exposed well creates an undercut region in the contact similar embodiments discussed above. The exposed well is solder plated prior to a singulation cut as in standard packaging procedure. When the semiconductor package is mounted on a substrate, the well region is filled with solder creating a fillet similar to embodiments discussed above.

BRIEF DESCRIPTION OF THE DRAWINGS

The invention, together with further objects and advantages thereof, may best be understood by reference to the following description taken in conjunction with the accompanying drawings in which.

DETAILED DESCRIPTION OF THE INVENTION

A number of improvements to leadless package designs are described below. In the following description, numerous specific details-are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

As described in the background section of the application, conventional semiconductor packaging processes result in a package with a plurality of solder-plated contacts exposed on the bottom surface of the package. FIG. 5A illustrates a compact solder joint 150 that results when the package is mounted to a circuit board attach pad 151 which in turn is part of a printed circuit board 153. Note that in FIG. 5A a portion of molding material 125 remains adhered to the underside of the contact 109 (and under the tie bar stub 112) after a conventional singulation cut. The tie bar stubs 112 are exposed at the peripheral edges of the package and are substantially co-planer with the package edge 154. The exposed portion of the tie bar stub 112 does not serve as an attachment point for the leadless lead frame package. Thus, the solder joint 150 between the contact 109 and the printed circuit board attach pad 151 is confined to a relatively small area (i.e., the area of the contact pad).

Although the solder joint 150 of FIG. 5A works well in a wide variety of application, in some applications it may be desirable to provide better solder joint visibility to better facilitate visual inspection of the solder joints and/or inspection by certain types of inspection machines. A weaker, less visible solder joint results because the molding material 125 partially obscures the joint. As can be appreciated by one skilled in the art, in some circumstances better visual confirmation of the solder joint of a particular package is desirable both for quality assurance and for troubleshooting purposes.

Figure 5B:
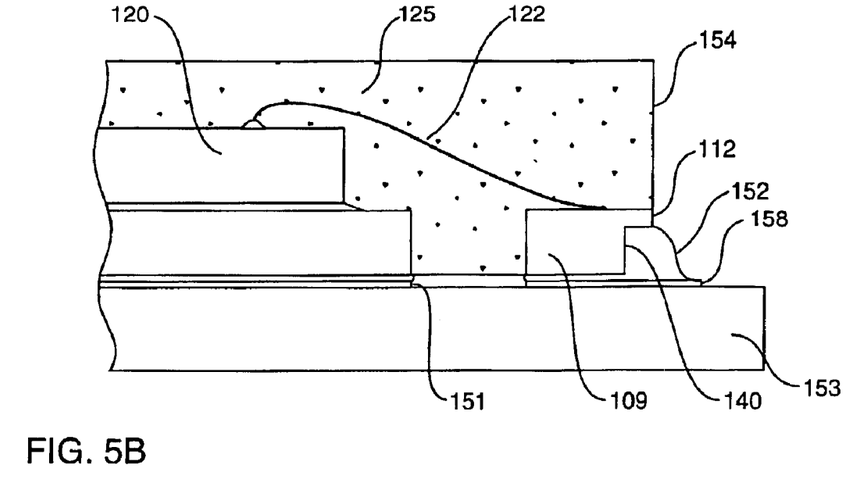
FIG. 5B is a diagrammatic cross sectional side view of a leadless lead frame package mounted on a printed circuit board in accordance with another embodiment of the present invention.

Referring next to FIG. 5B, a package in accordance with the present invention will be described. FIG. 5B illustrates a leadless lead frame package attached to a printed circuit board 153. In this illustration, the molding material previously attached to the underside of the contact 109 is removed such that the solder joint 152 fills a larger region and is readily visible from the side of the package.

One advantage of the present embodiment is that the solder joint 152 may be more easily inspected. Whereas the molding material 125 in FIG. 5A obstructs the view of solder joint 150, the solder joint 152 of the present invention (Referring to FIG. 5B) can readily be seen at the peripheral edge of the package. Therefore, the resulting solder joint 152 may be visually inspected for joint integrity. In some applications, the exposed solder joint 152 may also be more easily probed and tested since the solder joint can be readily accessed from the side of the package. For a fixed sized lead frame, this permits the use of somewhat larger solder joints which provides a greater potential mechanical strength to the joint due both to the increased area of attachment between the contact 109 and the landing pad 158 of the printed circuit board and to the increased volume of solder material in solder joint 152. In other applications, this permits the use of smaller device areas while maintaining the same solder joint footprint, which may be used to facilitate higher density lead frame panels.

Referring next to FIGS. 3–4, 5B, and 6B, a method of producing the described packages will be explained.

Generally, the lead frame panels may be formed and assembled using any appropriate process. By way of example, in a particular embodiment illustrated in FIG. 6B—a lead frame panel 180 is patterned to define a plurality of device areas and a matrix of tie bars. Each device area includes a multiplicity of conductive contacts that are attached to an associated tie bar. During assembly, dice are attached to die attach pads 181 or otherwise positioned within associated device areas (e.g., on a support tape if die attach pads are not provided). The dice are then electrically connected to the contacts (e.g., by wire bonding 182) and a casing is molded 183 or otherwise provided that encapsulates the die and connectors while leaving the bottom surfaces of the contacts exposed.

Figure 6B:
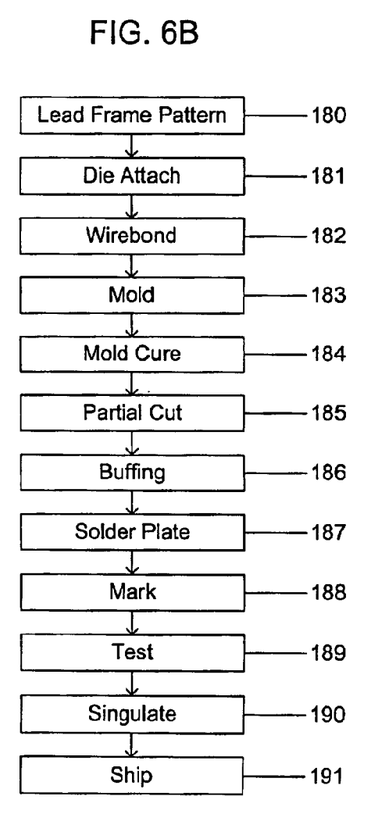
FIG. 6B is a flow chart illustrating a modified packaging process in accordance with an embodiment of the present invention.

After the encapsulation has cured 184, portions of the contacts adjacent to the tie bars are undercut without severing the tie bars 185. By way of example, the undercutting can be accomplished by a partial depth sawing operation along the tie bars. This undercutting exposes a side and an underside surface of the contacts. The lead frame package is then buffed 186 and solder-plated 187 using industry standard techniques. After the lead frame package has been marked 188, tested 189, and singulated 190 it is ready for shipping 191 or attachment to an electronic component as described above. It should be apparent that the primary difference between the present invention, and earlier processes is the addition of the Partial Cut 185. This step is generally illustrated in FIG. 3.

Figure 3:
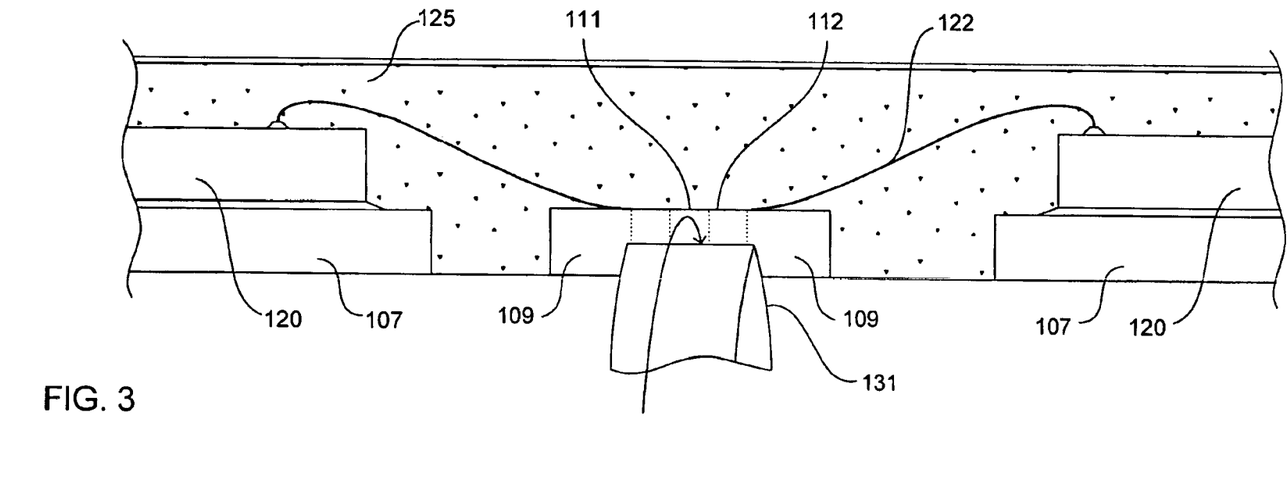
FIG. 3 is a diagrammatic cross sectional side view of a small section of an encapsulated lead frame panel in accordance with one embodiment of the present invention illustrating a partial cutting operation.

In FIG. 3, a partial sawing operation is illustrated. In this operation, a relatively wide blade 131 is passed along the tie bar axis. The blade 131 removes portions of the encapsulating molding (see above FIG. 2C 125), the tie bar 111, and the tie bar stub 112 thereby exposing the side and underside surfaces of adjacent contacts 109. Cleaning the molding material from the contacts 109 and their corresponding side and underside surfaces allows those surfaces to be solder-plated in a subsequent step. In the embodiment shown, a circular saw blade 131 is used, although it should be appreciated that any suitable technique may be used to remove the molding material to expose the contact side and underside surfaces including, but not limited to: grinding, etching, laser cutting, gouging, and other chemical and mechanical techniques. Furthermore, the partial sawing operation may be accomplished in single or multiple operational steps.

In the described embodiment, the width of the blade 131 is slightly wider than the width of the molding material 125 as shown in FIG. 3, therefore cleaning the molding material from the contacts 109 and their corresponding side and underside surfaces. The same result may be achieved using narrower blades in successive passes along the tie bar axes.

Figure 4A:
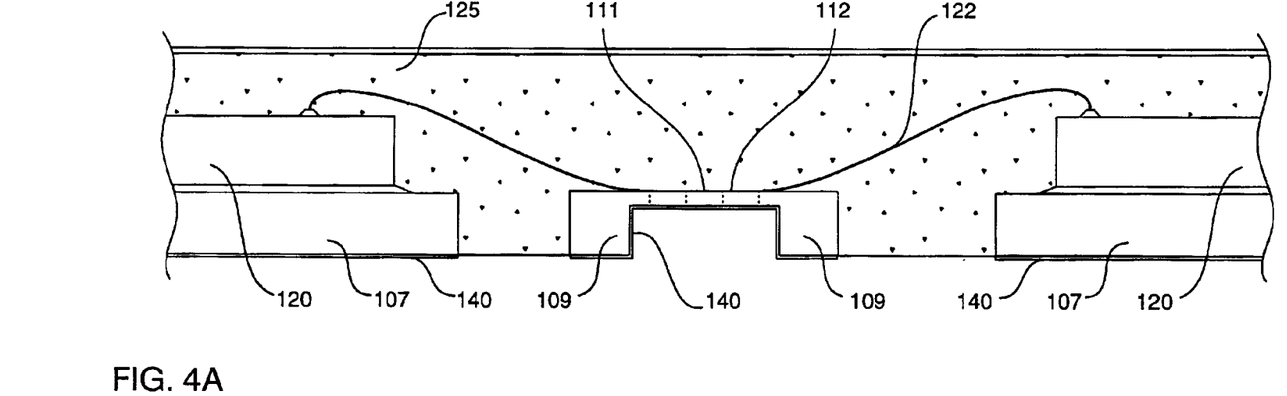
FIGS. 4A and 4B are diagrammatic cross sectional side views of the panel illustrated in FIG. 3 after the solder plating operation and during a singulation sawing operation, respectively.

FIG. 4A illustrates the resultant undercut surfaces from the partial saw pass. The exposed undercut surfaces created by the partial saw pass may now be solder-plated to facilitate attachment to printed circuit boards or other electronic devices. Solder plating the exposed surfaces prevents surface oxidation of the contacts 109 that inhibits a reliable solder connection to a printed circuit board or other electronic device. Solder plating 140 attaches to all exposed metallic surfaces including the adjacent contacts 109, the tie bar stub 112, the tie bar 111, and the die attach pads 107. Solder plating does not attach to the molding material 125.

Figure 4B:
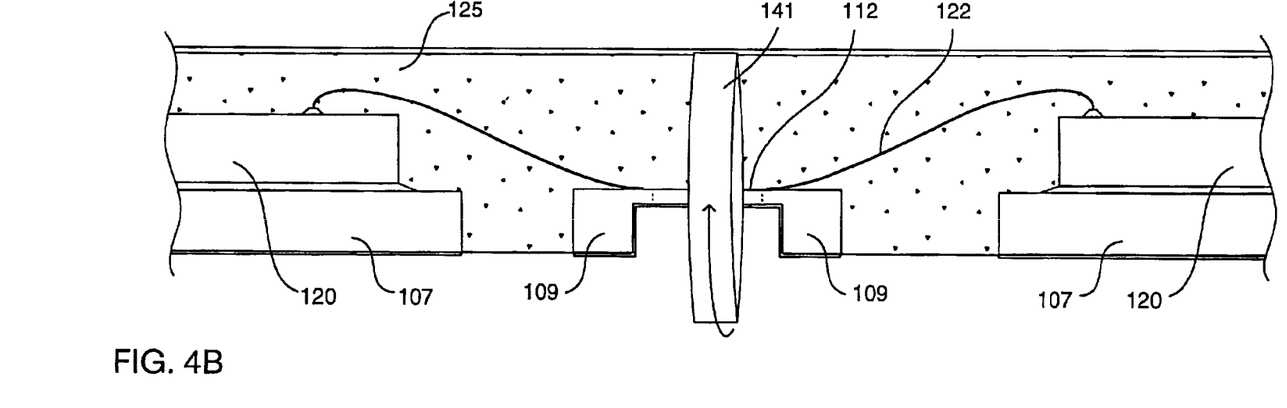

Once the contacts have been solder-plated, the lead frame panel is ready to be singulated or separated into individual devices. Referring to FIG. 4B, the singulation cut is accomplished by conventional means. In the present embodiment shown, a singulation blade 141 is passed along each tie bar axis on the lead frame panel. Singulation removes the tie bar 111, a portion of the tie stub 112, and a portion of the molding material 125 leaving exposed molding and contact surfaces discussed below. It should be appreciated that the singulation blade 141 is generally narrower than the blade 131 described above for use in making the undercut. With this arrangement, a gap is created between the side of the contact 109 and the edge of a package, which leaves the outside edges of the contacts 109, as well as the undersides of the tie bar stubs 112, exposed prior to solder plating. The ends of the tie bars stubs 112 are also exposed, however, they are not solder-plated.

The singulated packages may then be attached to a printed circuit board or other appropriate substrate using standard attachment techniques (e.g., soldering). FIG. 5B illustrates a finished and singulated leadless lead frame package mounted on a printed circuit board 153. As seen therein, the solder joint 152 fills an area to the peripheral side of the contact and under the tie bar stub 112 (which, in the version illustrated in FIG. 5A, is occupied by the molding material). This provides a strong, high quality joint that can be readily seen and accessed from the side as described above. It should be apparent that because the area of attachment of the contact 109 has been increased, the size of the landing pad 158 on the printed circuit board may need to be increased a corresponding amount. The larger solder joint 152 provides a more robust connection between the contact 109 and the printed circuit board landing pad 158 as well as a visual inspection point for solder joint integrity and a convenient test site that can be reached by conventional test probes over the prior art.

Figure 7A:
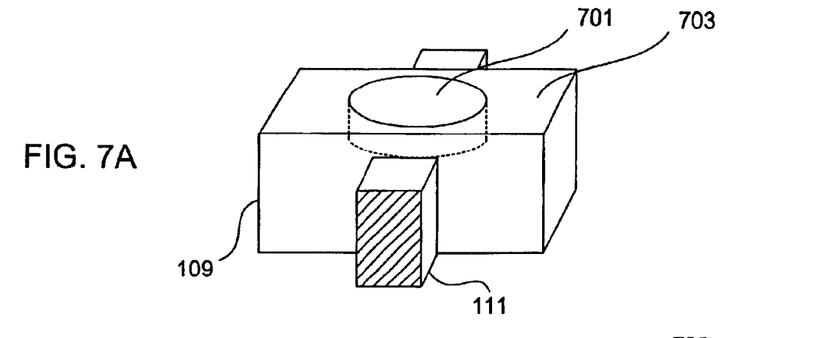
FIG. 7A is a 3-dimensional perspective view of a contact having a well created as a result of etching the contact surface in accordance with an embodiment of the present invention.

Referring next to FIG. 7A, another embodiment of the present invention will be described. FIG. 7A is a 3-dimensional perspective view of a contact 109 having a well 701 created as a result of etching the contact surface 703. Before a die is attached to the lead frame panel as in Step 1001 in FIG. 10, the lead frame panel is selectively etched at the intersection of the contact 109 and the tie bar 111. Etching the contact 109 has the advantage of eliminating a Partial Cutting step as in Step 185 in FIG. 6B. When the tie bars are etched to reduce their thickness, the simplest approach to forming the wells is to etch the wells at the same time that the tie bars are being etched. It may be appreciated by one skilled in the art that etching may be accomplished by a variety of methods well known in the art.

Figure 7B:
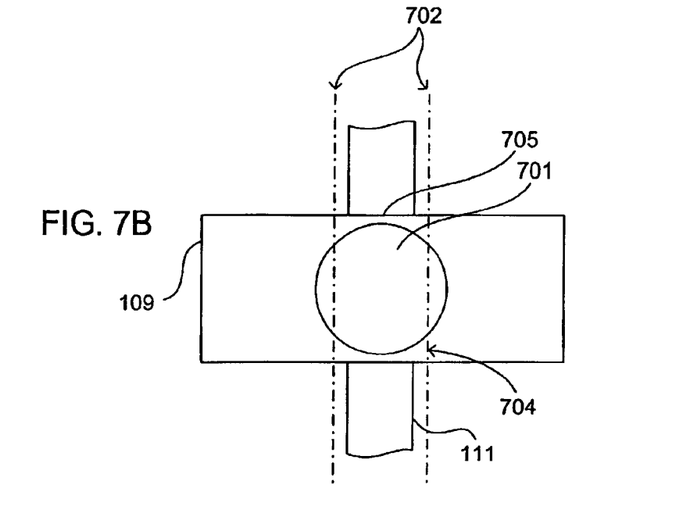
FIG. 7B is a diagrammatic top view of a contact having a well as shown in FIG. 7A.

FIG. 7B is a diagrammatic top view of a pair of contacts 109 having a well 701 as shown in FIG. 7A. As shown in FIG. 7B, the well 701 is aligned along the axis of the tie bar 111, which is part of a lead frame panel. The well 701 is sized such that the well 701 leaves an exposed region on both contacts after the singulation cut. Singulation cut-lines 702 demark the portions of the contact 109 and the tie bars 111 that are removed during singulation of the panel. The side wall 705 of the well 701 must be thick enough to withstand taping, encapsulating, and tape removal without collapsing as well as narrow enough to provide a reasonably sized well 701. Further, the leading edge 704 of the contact 109 must be accordingly sized to resist collapse during singulation and/or other subsequent manufacturing.

Figure 7C:
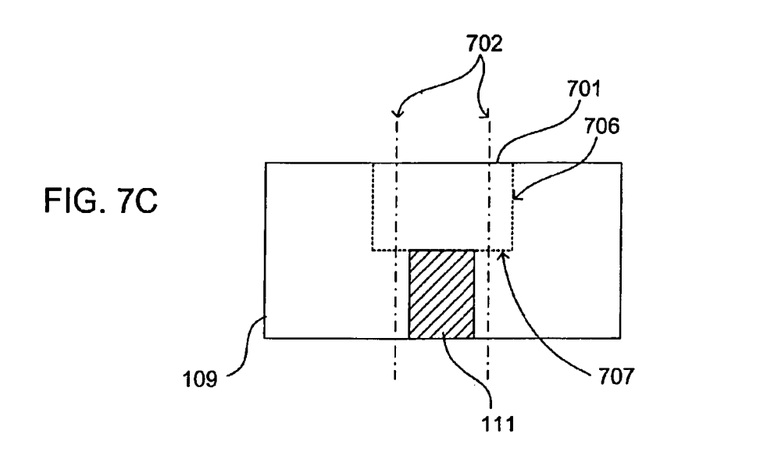
FIG. 7C is a diagrammatic cross sectional side view of a contact having a well as shown in FIG. 7A.

In another embodiment, a singulation cut as demarked by the singulation cut-lines 702 leaves a portion of the exposed well continuous side surface 706 and the well bottom surface 707 of the contact 109 as illustrated in FIG. 7C—a diagrammatic cross sectional side view of an embodiment of the present invention. When the package is ultimately attached by soldering to an electronic device, the solder flows to the undercut portions of the contact formed by the well side surface 706 and the well bottom surface 707 resulting in a stronger, more easily inspected and tested joint.

In one particular described embodiment, the etching creates an exposed well having an average depth of approximately 0.1 mm and an average circumference of approximately 0.3 mm. It is desirable in some embodiments to restrict the exposed well to within approximately 0.05 mm of the nearest side surface of the contact.

Figures 8A, 8B:
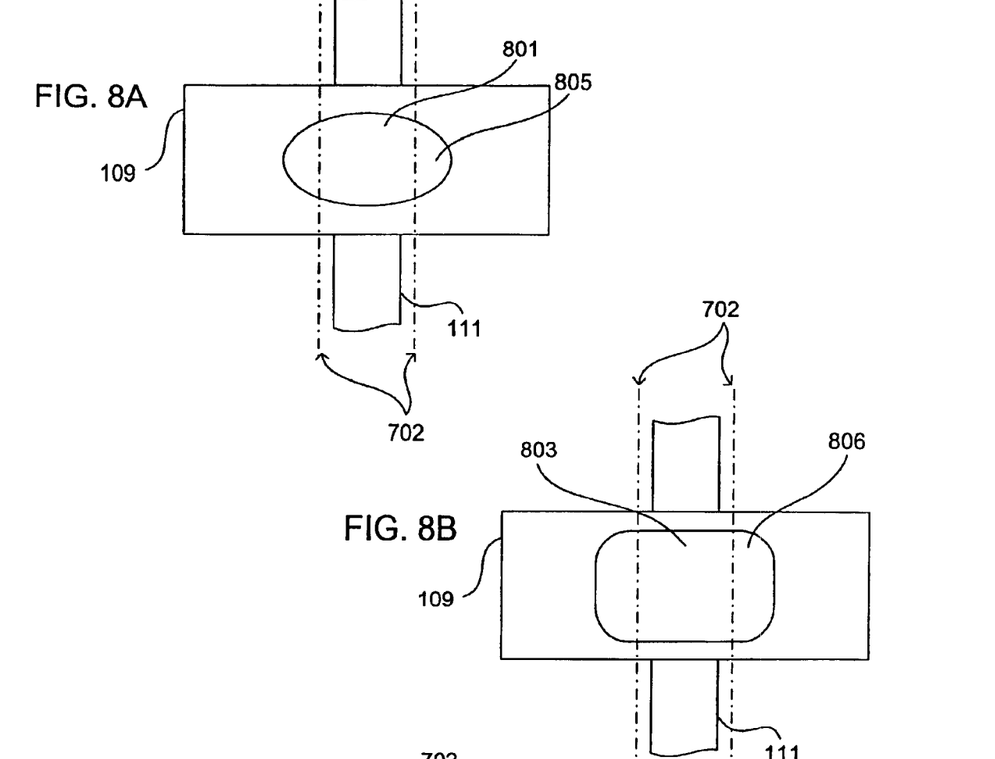
FIG. 8A is a diagrammatic top view of a preferred embodiment of a contact having an ovate well.
FIG. 8B is a diagrammatic top view of a preferred embodiment of a contact having a substantially rectangular well.
Figure 8C:
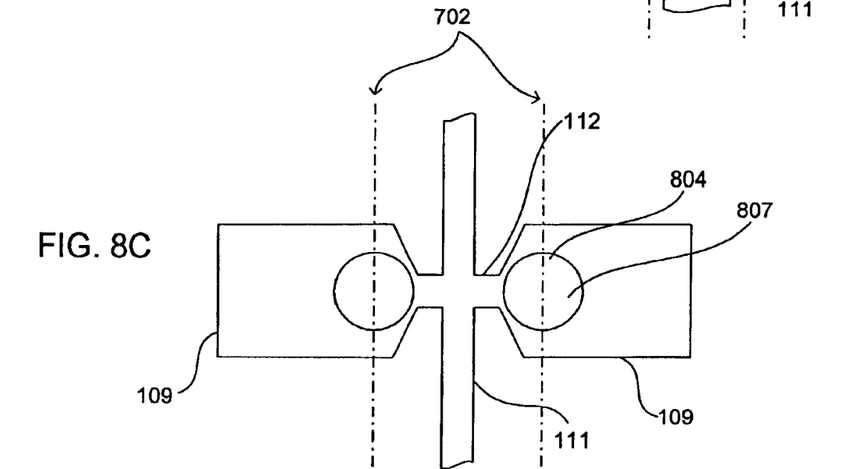
FIG. 8C is a diagrammatic top view of two contacts and their associated wells connected by tie bar stubs to a tie bar, which is part of a lead frame panel according to another embodiment of the present invention.

It should be appreciated that the shape of the wells may be widely varied. For example, FIGS. 8A–8C illustrate other suitable well geometries. FIG. 8A is a diagrammatic top view of a pair of contacts 109 having an ovate shaped well 801. One advantage of this embodiment is that the undercut region 805 of the contact after singulation, as demarked by the singulation cut-lines 702, is larger than a similarly sized circle as illustrated in FIG. 7B. FIG. 8B, a diagrammatic top view of a pair of contacts 109 having a substantially rectangular shaped well 803 illustrates another embodiment of the present invention. The rectangular shaped well provides an even larger undercut region 806 than a similarly sized ovate well as illustrated in FIG. 8A with similar advantages.

Another embodiment of the present invention is illustrated in FIG. 8C. FIG. 8C is a diagrammatic top view of a pair of contacts 109 having circular shaped wells 804. In this embodiment, the contacts 109 are connected to the tie bar 111 by tie bar stubs 112. Here, a smaller well 804 must be etched on each contact 109 to create an exposed region 807 in the resulting semiconductor package. As can be appreciated by one skilled in the art, a variety of well shapes may be achieved by selectively etching the lead frame surface depending on the particular manufacturing requirements.

Figure 9:
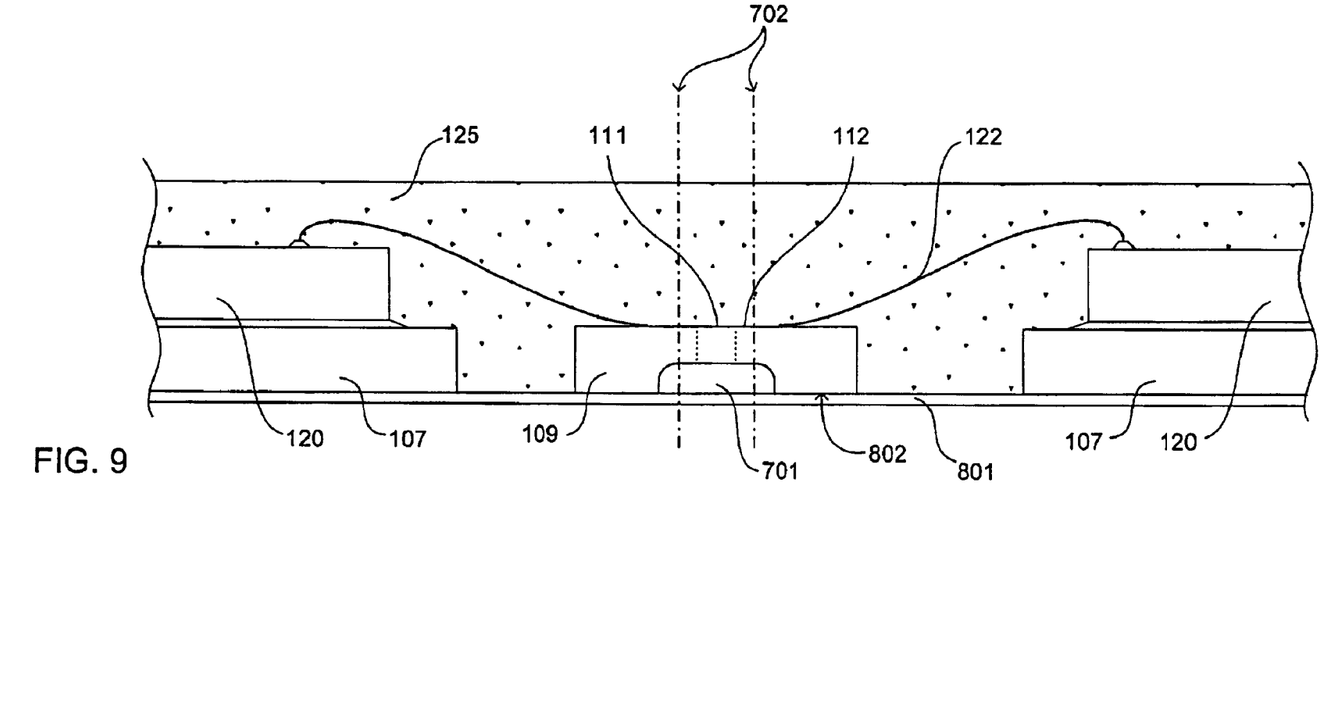
FIG. 9 is a diagrammatic cross sectional side view of a small section of the lead frame panel in accordance with one embodiment of the present invention illustrating the exposed well of the contact protected from encapsulation material.

FIG. 9 is a diagrammatic cross sectional side view of a small section of a lead frame panel in accordance with one embodiment of the present invention illustrating the exposed well 701 of the contact 109 protected from encapsulation material 125 prior to a singulation cut as demarked by singulation cut-lines 702. Prior to encapsulation, adhesive tape 801 is adhered to the bottom surface 802 of the lead frame panel. The adhesive tape 801 seals the well 701 thus preventing encapsulating material 125 from filling the void therein. The adhesive tape 801 also serves to ensure the encapsulating material 125 is substantially co-planer with the bottom surface 802 of the lead frame panel.

Figure 10:
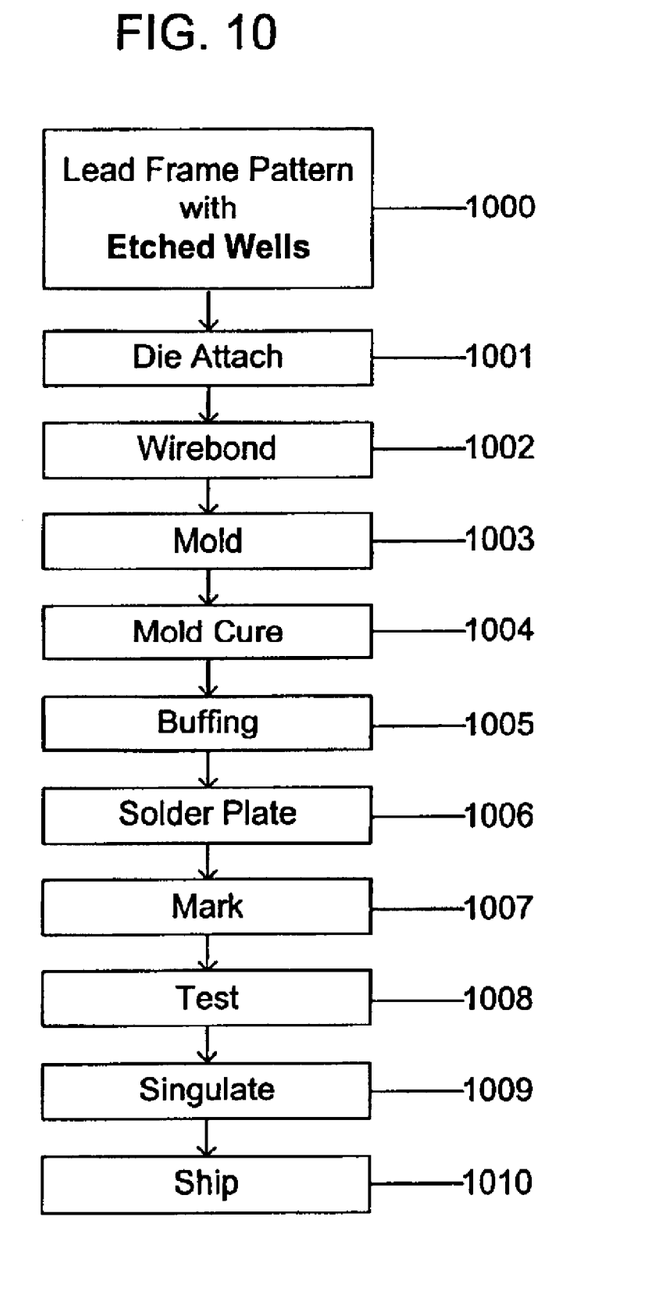
FIG. 10 is a flow chart illustrating a modified packaging process in accordance with another embodiment of the present invention.

FIG. 10 is a flow chart illustrating a modified packaging process in accordance with an embodiment of the present invention. Note in particular, the first step 1000 wherein a lead frame pattern is provided with etched wells. Etching is accomplished by any means common in the art to provide any of a number of shaped wells as described above. It may be appreciated that etching the lead frame pattern eliminates a subsequent Partial Cut step 185 as illustrated in FIG. 6B. As a further advantage, well etching may be accomplished at the same time as the lead frame is etched to create device areas, contacts, and tie bars. Once the pattern has been provided, packaging of the device follows conventional manufacturing steps 1001–1010 as illustrated in FIG. 10.

Although only a few embodiments of the invention have been described in detail, it should be understood that the present invention might be embodied in many other specific forms without departing from the spirit or scope of the invention. For example, it should be apparent that the described undercutting may be used with a wide variety of packaging processes and the application of the invention is not limited to the particular packaging processes described.

As suggested, a variety of methods may be utilized to accomplish the partial sawing. Further, the depth and width of the partial sawing may be widely varied. By way of example, the initial cut may have an average depth of approximately 0.125 mm and an average width of approximately greater than 0.25 mm. Specific depths and widths of the partial saw are dependent on a particular application and are contemplated in this application. In the primary embodiment described, a single sawing pass using a relatively wider blade is used to accomplish the undercutting. However, it should be appreciated that the same effect can be realized using multiple passes of a thinner blade. In the illustrated embodiments, narrower tie bar stubs 112 are used to couple the contacts to narrow tie bars 111. The narrowed tie bars and tie bar stubs tend to be preferred to minimize the risk of shorting between contacts due to copper (or other metal) streaking during sawing. However, the invention may also be used in embodiments where tie bar stubs are not used and/or thicker tie bars are used. In other applications, the tie bar stubs may be the same width (or wider) than the contacts providing additional surfaces to which the solder can adhere.

Moreover, in another embodiment of the present invention the distance between the bottom surface portions of adjacent contacts in adjacent device areas are spaced to no more than approximately 0.45 mm. Spacing between the contacts is critical because of the partial cut operation. In particular, if the spacing is too narrow, the partial cut operation will remove an excessive amount of contact material thus compromising the electronic and mechanical integrity of the contact. Alternatively, if the contact spacing is too wide, then the partial cut operation may remove material only from the tie bar stubs rather than from the contacts.

Additionally, the size, geometry and placement of the described wells may be widely varied without departing from the spirit of the invention. As suggested above, the wells can be circular, oval, rectangular, square, elongated or any appropriate geometry and the size of the side walls can be varied to meet the needs of a particular embodiment.

As suggested above, when it is known that the described process will be used, the lead frame panels may be designed to take advantage of the greater strength solder bonds that are achievable. By way of example, the size of the contact pads that are co-planer with the bottom surface of the package can be reduced while maintaining overall joint strength.

The invention may be used in conjunction with any suitable conductive lead frame material. In present applications, copper and copper alloy-42 are the most common lead frame materials, but the invention may be used in conjunction with lead frames made from other materials, including aluminum and other metals. A number of conventional package processing techniques have been described as being used to accomplish specific steps in the formation of the described devices. It should be apparent that in most cases these processing techniques can be widely varied and a wide variety of alternative conventional processes may be used in their place. Accordingly, the present examples are to be considered as illustrative and not restrictive, and the invention is not to be limited to the details given herein, but may be modified within the scope of the appended claims.

What is claimed is:

1. A method of packaging semiconductor devices comprising:

provliding a lead frame panel patterned to define a plurality of device areas and a matrix of tie bars having tie bar axes, each device area including a multiplicity of conductive contacts that are attached to an associated tie bar;

positioning a plurality of dice within the lead frame, each die being positioned within an associated device area;

electrically connecting each die to the contacts of its associated device area using connectors;

forming at least one casing over the device areas, thereby encapsulating the connectors and providing mechanical support for the contacts while leaving the bottom surfaces of the contacts exposed;

undercutting portions of the contacts adjacent the tie bars thereby exposing at least some side and underside surfaces of the contacts; and solder plating the lead frame after the undercutting such that the exposed conductive contacts including the exposed side and underside surfaces are solder-plated.

2. A method as recited in claim 1 further comprising singulating the device areas thereby providing singulated packaged semiconductor devices.

3. A method as recited in claim 2, wherein the singulation is accomplished by severing along the tie bars.

4. A method as recited in claim 2 wherein the undercutting is accomplished by sawing along the tie bar axis using a first blade and the singulation is accomplished by sawing along the tie bar axis using a second blade that is narrower than the first blade, wherein the undercutting sawing operation does not sever the tie bars.

5. A method of packaging semiconductor devices comprising:

providing a lead frame panel is patterned to define at least one two-dimensional matrix of tie bars that define a two dimensional array of immediately adjacent device areas that are separated only by the tie bars, each device area including a multiplicity of conductive contacts that are attached to an associated tie bar and wherein the contacts are patterned to include a base portion that includes the exposed bottom surface and stub portions that attach to the tie bars, the stub portions being thinner and narrower than the base portions of their associated contacts;

positioning a plurality of dice within the lead frame, each die being positioned within an associated device area;

electrically connecting each die to the contacts of its associated device area using connectors;

forming at least one casing over the device areas, thereby encapsulating the connectors and providing mechanical support for the contacts while leaving the bottom surfaces of the contacts exposed;

undercutting portions of the contacts adjacent the tie bars thereby exposing at least some side and underside surfaces of the contacts; and solder plating the lead frame after the undercutting such that the exposed conductive contacts including the exposed side and underside surfaces are solder-plated.

6. A method as recited in claim 5 wherein the undercutting is accomplished by a first cutting operation along the tie bar axes, wherein the first cutting operation exposes the stubs and a side portion of the base of each contact, but does not sever the tie bars or the stubs, the method further comprising singulating the device areas after the solder plating using a second cutting operation along the tie bar axis.

7. A method as recited in claim 6 wherein the first cutting operation is performed using a first saw blade and the second cutting operation is performed using a second saw blade that is narrower than the first blade.

8. A method of packaging semiconductor devices comprising:

providing a lead frame panel patterned to define a plurality of device areas and a matrix of tie bars having tie bar axes, each device area including a multiplicity of conductive contacts that are attached to an associated tie bar wherein at least some of the contacts have wells formed therein;

positioning a plurality of dice within the lead frame, each die being positioned within an associated device area;

electrically connecting each die to the contacts of its associated device area using connectors;

forming at least one casing over the device areas, thereby encapsulating the connectors and providing mechanical support for the contacts while leaving the bottom surfaces of the contacts exposed;

solder plating the lead frame after the at least one casing has been formed such that the exposed conductive contacts including the exposed wells are solder-plated.

9. A method as recited in claim 8 further comprising singulating the device areas thereby providing singulated packaged semiconductor devices.

10. A method as recited in claim 9 wherein the singulation is accomplished by severing along the tie bars.

11. A method of packaging semiconductor devices comprising:

providing a lead frame panel patterned to define a plurality of device areas and a two dimensional matrix of tie bars having tie bar axes each device area including a multiplicity of conductive contacts that are attached to an associated tie bar wherein at least some of the contacts have wells formed therein wherein the wells each include a continuous side surface and a well bottom surface;

positioning a plurality of dice within the lead frame, each die being positioned within an associated device area;

electrically connecting each die to the contacts of its associated device area using connectors;

forming at least one casing over the device areas using an encapsulant material, thereby encapsulating the connectors and providing mechanical support for the contacts while leaving the bottom surfaces of the contacts exposed, wherein the casing is formed with the wells in place, the geometry of the contacts being arranged such that encapsulant does not enter the wells during the formation of the casing; and solder plating the lead frame after the at least one casing has been formed such that the exposed conductive contacts including the exposed wells are solder-plated.

12. A method as recited in claim 11 wherein the continuous side surface is arcuate.

13. A method as recited in claim 11 wherein the continuous side surface is substantially rectangular.

* * * * *

UNITED STATES PATENT AND TRADEMARK OFFICE
CERTIFICATE OF CORRECTION

PATENT NO. : 6,872,599 B1
DATED : March 29, 2005
INVENTOR(S) : Li et al.

It is certified that error appears in the above-identified patent and that said Letters Patent is hereby corrected as shown below:

Column 1,
Line 20, change "fine tie bars" to -- fine tie bars 111 --.

Column 9,
Line 29, change "panel is patterned" to -- panel patterned --.

Signed and Sealed this

Fifth Day of July, 2005

JON W. DUDAS
*Director of the United States Patent and Trademark Office*